(12) United States Patent
Schepis et al.

(10) Patent No.: US 12,374,562 B2
(45) Date of Patent: Jul. 29, 2025

(54) WAFER SHAPE CONTROL FOR W2W BONDING

(71) Applicant: Tokyo Electron Limited, Tokyo (JP)

(72) Inventors: Anthony R. Schepis, Averill Park, NY (US); Andrew Weloth, Albany, NY (US); David C. Conklin, Saratoga Springs, NY (US); Anton J. Devilliers, Clifton Park, NY (US)

(73) Assignee: Tokyo Electron Limited, Tokyo (JP)

( * ) Notice: Subject to any disclaimer, the term of this patent is extended or adjusted under 35 U.S.C. 154(b) by 443 days.

(21) Appl. No.: 17/885,097

(22) Filed: Aug. 10, 2022

(65) Prior Publication Data

US 2023/0326767 A1 Oct. 12, 2023

Related U.S. Application Data

(60) Provisional application No. 63/328,823, filed on Apr. 8, 2022, provisional application No. 63/328,825, filed on Apr. 8, 2022.

(51) Int. Cl.
*H01L 21/56* (2006.01)
*H01L 21/02* (2006.01)
(Continued)

(52) U.S. Cl.
CPC .......... *H01L 21/56* (2013.01); *H01L 21/0226* (2013.01); *H01L 21/67063* (2013.01);
(Continued)

(58) Field of Classification Search
CPC ................ H01L 21/56; H01L 21/0226; H01L 21/67063; H01L 21/67092; H01L 21/67098; H01L 21/67109; H01L 21/67225; H01L 21/68; H01L 22/20; H01L 22/34; H01L 23/3171; H01L 24/80; H01L 23/291; H01L 24/08; H01L 2224/08145; H01L 2224/80007; H01L 2224/80011; H01L 2224/80013; H01L 21/02002;
(Continued)

(56) References Cited

U.S. PATENT DOCUMENTS 9,184,041 B2 11/2015 Chen et al.
9,397,051 B2 7/2016 Uzoh
(Continued)

FOREIGN PATENT DOCUMENTS

JP 2019-16748 A 1/2019
KR 10-2021-0044654 A 4/2021

OTHER PUBLICATIONS

International Search Report & Written Opinion issued Jun. 19, 2023 in PCT/US2023/013553, 9 pages.

*Primary Examiner* — John P. Dulka
(74) *Attorney, Agent, or Firm* — Oblon, McClelland, Maier & Neustadt, L.L.P.

(57) ABSTRACT

A method, for bonding a first wafer to a second wafer, includes generating a first modification map based on wafer shape data of the first wafer and the second wafer. The first modification map defines adjustments to internal stresses of the first wafer. A first wafer shape of the first wafer is modified by forming a first stressor film on the first wafer based on the first modification map. The first wafer is aligned with the second wafer after the modifying. The first wafer is bonded to the second wafer.

20 Claims, 11 Drawing Sheets

(51) Int. Cl.
*H01L 21/66* (2006.01)
*H01L 21/67* (2006.01)
*H01L 21/68* (2006.01)
*H01L 23/00* (2006.01)
*H01L 23/29* (2006.01)
*H01L 23/31* (2006.01)

(52) U.S. Cl.
CPC .. *H01L 21/67092* (2013.01); *H01L 21/67098* (2013.01); *H01L 21/67109* (2013.01); *H01L 21/67225* (2013.01); *H01L 21/68* (2013.01); *H01L 22/20* (2013.01); *H01L 22/34* (2013.01); *H01L 23/3171* (2013.01); *H01L 24/80* (2013.01); *H01L 23/291* (2013.01); *H01L 24/08* (2013.01); *H01L 2224/08145* (2013.01); *H01L 2224/80007* (2013.01); *H01L 2224/80011* (2013.01); *H01L 2224/80013* (2013.01)

(58) Field of Classification Search
CPC ................ H01L 21/185; H01L 22/12; H01L 2224/80895; H01L 2224/80896; H01L 2924/3511; H01L 21/67069; H01L 21/67288
See application file for complete search history.

(56) References Cited

U.S. PATENT DOCUMENTS

| | | |
|---|---|---|
| 9,646,938 B2 | 5/2017 | Chen et al. |
| 9,853,000 B2 | 12/2017 | Uzoh |
| 10,276,513 B2 | 4/2019 | Chen et al. |
| 10,833,026 B2 | 11/2020 | Chen et al. |
| 10,910,328 B2 | 2/2021 | Ko et al. |
| 11,322,382 B2 | 5/2022 | Ji |
| 11,410,948 B2 | 8/2022 | Chen et al. |
| 2014/0374879 A1 | 12/2014 | Chen et al. |
| 2015/0155241 A1 | 6/2015 | Uzoh |
| 2016/0035682 A1 | 2/2016 | Chen et al. |
| 2016/0293556 A1 | 10/2016 | Uzoh |
| 2017/0243836 A1 | 8/2017 | Chen et al. |
| 2018/0047699 A1* | 2/2018 | Omori ................ H01L 21/2007 |
| 2019/0244914 A1 | 8/2019 | Chen et al. |
| 2020/0091089 A1 | 3/2020 | Ko et al. |
| 2021/0091022 A1 | 3/2021 | Documents |
| 2021/0111060 A1 | 4/2021 | Ji |
| 2021/0296282 A1* | 9/2021 | Gao ........................ H01L 24/08 |
| 2021/0375829 A1* | 12/2021 | Or-Bach ................ H01L 25/50 |
| 2022/0013416 A1* | 1/2022 | Ip ............................ H01L 22/12 |
| 2022/0336392 A1 | 10/2022 | Chen et al. |
| 2023/0195002 A1* | 6/2023 | Mizuta ................. G03F 9/7088 356/399 |
| 2023/0275063 A1* | 8/2023 | Hong ..................... H01L 24/08 257/777 |

* cited by examiner

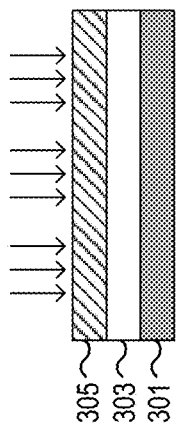
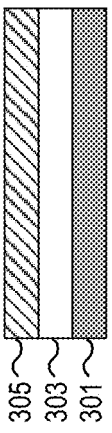
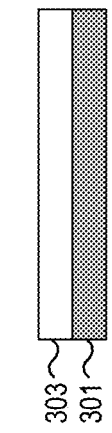
Figure 3A  Figure 3B  Figure 3C
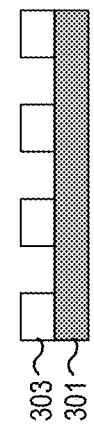
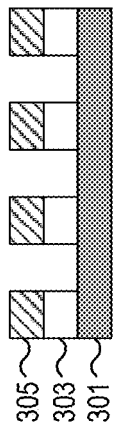
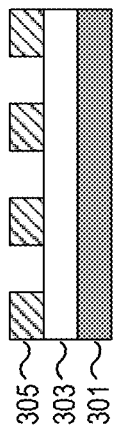
Figure 3D  Figure 3E  Figure 3F

| Wafer Bow | Compressive Orientation Bottom Chuck | | Tensile Orientation Bottom Chuck |
|---|---|---|---|
| µm | 0 µm | 200 µm | 0 µm |
| -150 | -80.0 | -80.2 | -80.0 |
| -220 | -80.1 | -80.1 | -80.1 |
| -301 | -80.0 | -78.4 | -79.7 |
| -367 | FAIL | FAIL | -79.7 |
| -420 | FAIL | FAIL | -79.7 |
Figure 7
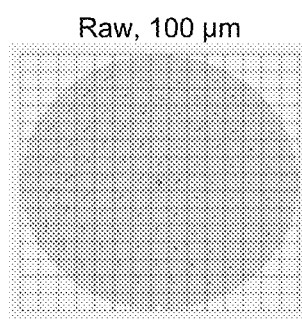
Raw, 100 µm
Figure 8A
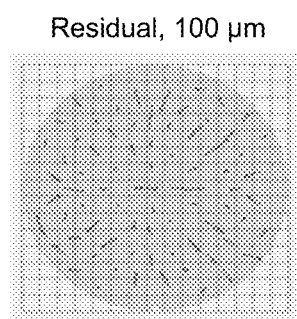
Residual, 100 µm
Figure 8B
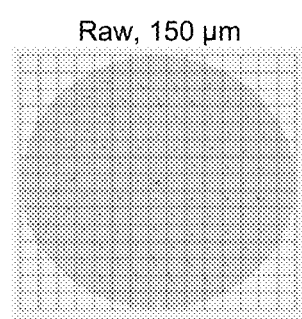
Raw, 150 µm
Figure 8C
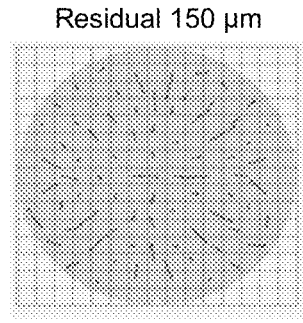
Residual 150 µm
Figure 8D (Related Example)

WAFER SHAPE CONTROL FOR W2W BONDING

INCORPORATION BY REFERENCE

This present disclosure claims the benefit of U.S. Provisional Application Nos. 63/328,825 and 63/328,823 filed on Apr. 8, 2022, each of which is incorporated herein by reference in its entirety.

FIELD OF THE INVENTION

This disclosure relates generally to semiconductor fabrication and particularly to wafer overlay control.

BACKGROUND

Semiconductor fabrication involves multiple varied steps and processes. One typical fabrication process is known as photolithography (also called microlithography). Photolithography uses radiation, such as ultraviolet or visible light, to generate fine patterns in a semiconductor device design. Many types of semiconductor devices, such as diodes, transistors, and integrated circuits, can be constructed using semiconductor fabrication techniques including photolithography, etching, film deposition, surface cleaning, metallization, and so forth.

Exposure systems (also called exposure tools) are used to implement photolithographic techniques. An exposure system typically includes an illumination system, a reticle (also called a photomask) or spatial light modulator (SLM) for creating a circuit pattern, a projection system, and a wafer alignment stage for aligning a photosensitive resist-covered semiconductor wafer. The illumination system illuminates a region of the reticle or SLM with a (preferably) rectangular slot illumination field. The projection system projects an image of the illuminated region of the reticle pattern onto the wafer. For accurate projection, it is important to expose a pattern of light on a wafer that is relatively flat or planar, preferably having less than 10 microns of height deviation.

SUMMARY

The present disclosure relates to a method for bonding wafers together.

According to a first aspect of the disclosure, a method, for bonding a first wafer to a second wafer, is provided. The method includes generating a first modification map based on wafer shape data of the first wafer and the second wafer. The first modification map defines adjustments to internal stresses of the first wafer. A first wafer shape of the first wafer is modified by forming a first stressor film on the first wafer based on the first modification map. The first wafer is aligned with the second wafer after the modifying. The first wafer is bonded to the second wafer.

In some embodiments, the modifying the first wafer shape of the first wafer further includes modifying the first stressor film based on the first modification map.

In some embodiments, the modifying the first stressor film includes exposing the first stressor film to a pattern of electromagnetic radiation based on the first modification map.

In some embodiments, a photoresist layer of the first stressor film is developed to form a relief pattern.

In some embodiments, a shape control layer of the first stressor film is etched using the relief pattern as an etching mask.

In some embodiments, the first stressor film is exposed to the pattern of electromagnetic radiation by direct-write.

In some embodiments, the modifying the first stressor film includes applying heat to the first stressor film.

In some embodiments, the heat is applied to the first stressor film using a heat array with heat zones having independent temperature control.

In some embodiments, a respective current is flowed through each resistor of the heat array so that each resistor generates a respective amount of heat.

In some embodiments, the heat is applied to the first stressor film using a laser system that is configured to heat at least one of the first wafer or a wafer chuck that is configured to hold the first wafer.

In some embodiments, the modifying the first stressor film includes implanting ions into the first stressor film.

In some embodiments, the first stressor film is kept unmodified between the forming the first stressor film and the aligning the first wafer with the second wafer.

In some embodiments, the forming the first stressor film includes forming the first stressor film as a blanket film.

In some embodiments, the first wafer has a front side working surface and a backside surface opposite the front side working surface. The first stressor film is formed on the backside of the first wafer.

In some embodiments, a second modification map is generated based on the wafer shape data of the first wafer and the second wafer. The second modification map defines adjustments to internal stresses of the second wafer. A second wafer shape of the second wafer is modified by forming a second stressor film on the second wafer based on the second modification map.

In some embodiments, the modifying the second wafer shape of the second wafer further includes modifying the second stressor film based on the second modification map.

In some embodiments, the wafer shape data of the first wafer and the second wafer are measured using one or more metrology tools.

In some embodiments, the measuring the wafer shape data includes measuring relative z-height values of the first wafer and the second wafer by bow measurement.

In some embodiments, the first modification map is generated based on historic data in addition to the wafer shape data of the first wafer and the second wafer. The historic data include overlay information of historic wafers.

According to a second aspect of the disclosure, a method, for bonding a first wafer to a second wafer, is provided. The method includes receiving wafer shape data of the first wafer and the second wafer from one or more metrology tools. A first modification map and a second modification map are generated based on the wafer shape data of the first wafer and the second wafer. The first modification map defines adjustments to internal stresses of the first wafer, and the second modification map defines adjustments to internal stresses of the second wafer. A first wafer shape of the first wafer is modified by forming a first stressor film on the first wafer based on the first modification map. A second wafer shape of the second wafer is modified by forming a second stressor film on the second wafer based on the second modification map. The first wafer is aligned with the second wafer after the modifying the first wafer shape and after the modifying the second wafer shape. The first wafer is bonded to the second wafer.

Note that this summary section does not specify every embodiment and/or incrementally novel aspect of the present disclosure or claimed invention. Instead, this summary only provides a preliminary discussion of different embodiments and corresponding points of novelty. For additional details and/or possible perspectives of the invention and embodiments, the reader is directed to the Detailed Description section and corresponding figures of the present disclosure as further discussed below.

BRIEF DESCRIPTION OF THE DRAWINGS

Aspects of the present disclosure are best understood from the following detailed description when read with the accompanying figures. It is noted that, in accordance with the standard practice in the industry, various features are not drawn to scale. In fact, the dimensions of the various features may be increased or reduced for clarity of discussion.

FIGS. 3A, 3B, 3C, 3D, 3E and 3F show cross-sectional views of a wafer at various intermediate steps of manufacturing, in accordance with some embodiments of the present disclosure.

FIG. 7 shows an example of warped wafer test results.

FIG. 8A shows an example of raw bonding errors.

FIG. 8B shows an example of residual bonding errors.

FIG. 8C shows another example of raw bonding errors.

FIG. 8D shows another example of residual bonding errors.

DETAILED DESCRIPTION

Figure 1A:
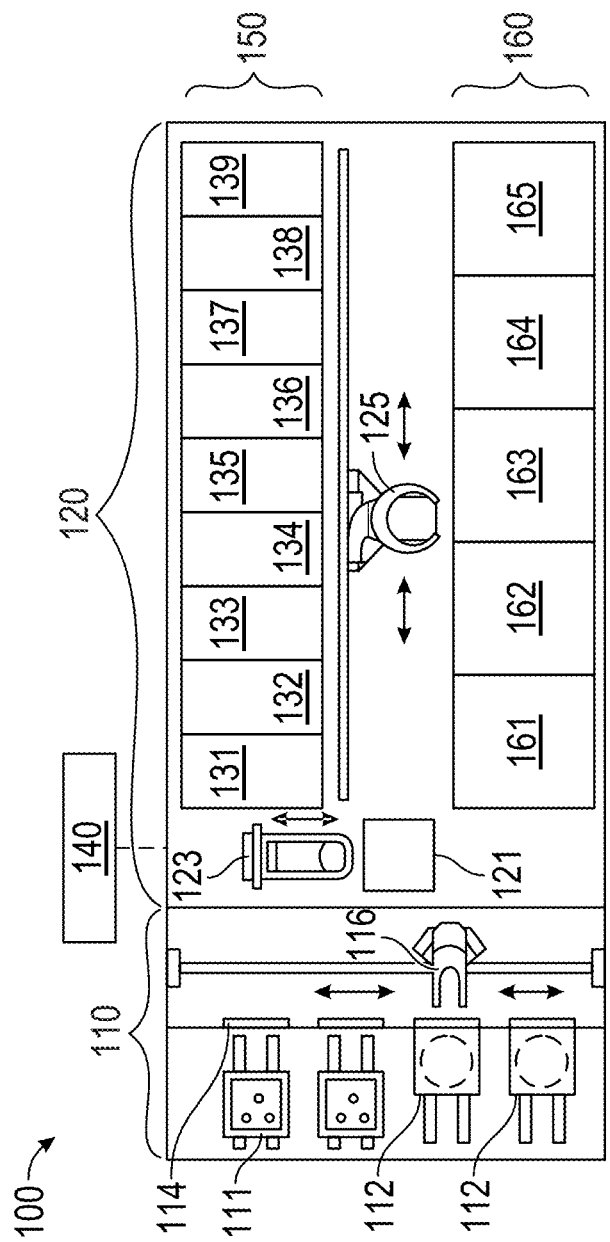
FIG. 1A is a plan view of a hybrid system, in accordance with some embodiments of the present disclosure.

The following disclosure provides many different embodiments, or examples, for implementing different features of the provided subject matter. Specific examples of components and arrangements are described below to simplify the present disclosure. These are, of course, merely examples and are not intended to be limiting. For example, the formation of a first feature over or on a second feature in the description that follows may include embodiments in which the first and second features are formed in direct contact, and may also include embodiments in which additional features may be formed between the first and second features, such that the first and second features may not be in direct contact. In addition, the present disclosure may repeat reference numerals and/or letters in the various examples. This repetition is for the purpose of simplicity and clarity and does not in itself dictate a relationship between the various embodiments and/or configurations discussed. Further, spatially relative terms, such as "top," "bottom," "beneath," "below," "lower," "above," "upper" and the like, may be used herein for ease of description to describe one element or feature's relationship to another element(s) or feature(s) as illustrated in the figures. The spatially relative terms are intended to encompass different orientations of the device in use or operation in addition to the orientation depicted in the figures. The apparatus may be otherwise oriented (rotated 90 degrees or at other orientations) and the spatially relative descriptors used herein may likewise be interpreted accordingly.

The order of discussion of the different steps as described herein has been presented for clarity sake. In general, these steps can be performed in any suitable order. Additionally, although each of the different features, techniques, configurations, etc. herein may be discussed in different places of this disclosure, it is intended that each of the concepts can be executed independently of each other or in combination with each other. Accordingly, the present invention can be embodied and viewed in many different ways.

A typical semiconductor device can be comprised of many layers, such as over seventy individual layers. Each level requires multiple process steps including but not limited to thin film deposition, lithography and etching to form the desired structures. Non-uniform wafer stresses induced through these fundamental operations result from the patterning of thin films and are amplified via multiple temperature cycling processes, fundamentally distorting the wafer grid.

Figure 6A:
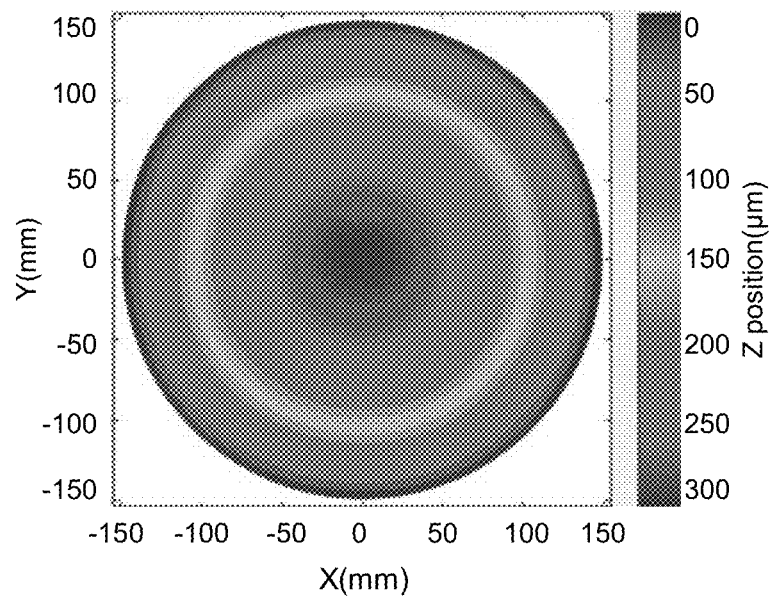
FIG. 6A shows an example of low order wafer deformation.
Figure 6B:
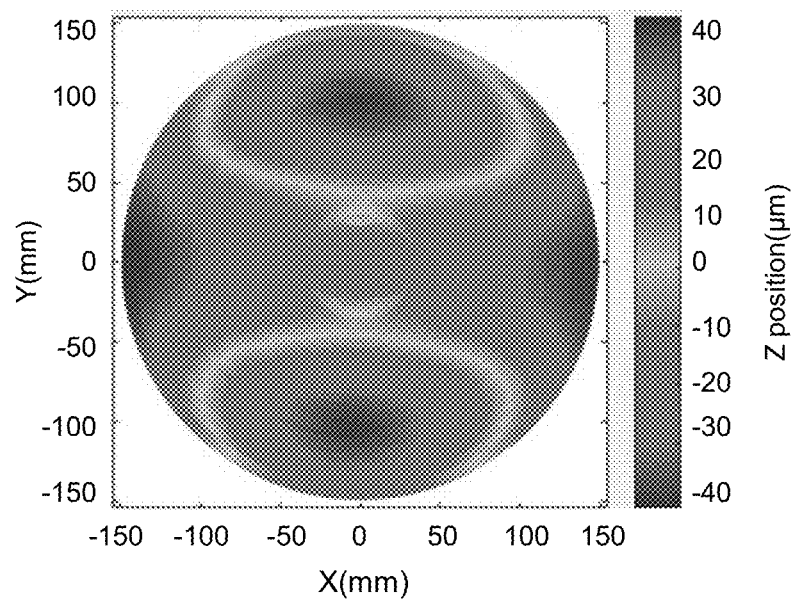
FIG. 6B shows an example of high order wafer deformation.

These (wafer shape) distortions can manifest as low order global spherical type deformations as depicted in FIG. 6A. Higher order localized height variations may exist as stand-alone distortions or may be embedded in the global signature. An example of a higher order wafer deformation is presented in FIG. 6B. The data presented is derived from conventional semiconductor metrology equipment common to the industry. Both low order and high order wafer deformations can complicate the W2W (wafer-to-wafer) bonding process and negatively impact yield, for example resulting in yield losses.

The integrity of the wafer (grid) is paramount to not only being able to handle a wafer as the wafer moves through modules of semiconductor manufacturing equipment but can also have significant yield implications during bonding processes. With the advent of 3D packaging, the semiconductor industry is entering a critical juncture where traditional bonding based alignment corrections are not able to account for the non-linear physical wafer effects induced via processing. That is to say, stresses enacted on the wafer prior to the bonding operation impart global and localized wafer shape distortions that cause alignment failures and can compromise critical bonding metrics, directly resulting in significant yield loss in advanced packaging processes.

The purpose of a wafer bonding system is to connect (or join) two component wafers together in one mechanically stable package. As such, a W2W bonding platform consists of handling mechanisms and process modules for the upper (top) and lower (bottom) wafers. The intricacies of which are not pertinent to this disclosure aside from the fact that alignment tolerances exist when integrating the wafers to yield a functioning device which will be addressed in further detail below.

Wafer shape distortions can impact the most fundamental operation of a W2W system—the handling of wafers. If wafer warp (or wafer bow) inhibits the transfer and/or chucking of wafers, the effective yield of the bonding process is zero. FIG. 7 demonstrates such a failure in a HVM (high volume manufacturing) W2W bonding tool. As shown, wafers with greater than approximately 370 μm of compressively induced strain (or wafer bow) had a critical handling failure requiring manual recovery from the system. That is to say, the wafers in current distorted states prevented processing altogether. Note that the threshold of the wafer bow for causing handling failure may vary depending on specific tools. 370 μm is used herein as one example for illustrative purposes.

On the (same) HVM W2W bonding tool (platform) as used in FIG. 7, these wafers created residual bonding errors as shown in FIGS. 8A-8D. Specifically, FIGS. 8A and 8B show raw errors and residual errors of one wafer having a wafer bow of 100 μm. FIGS. 8C and 8D show raw errors and residual errors of another wafer having a wafer bow of 150 μm. It is noted that residual errors are uncorrectable by the construct of the system (e.g. the HVM W2W bonding tool) and may represent the best case result even with feed forward/backward correction applied. As understood by those familiar in the art, if these residual (overlay) errors are large enough in magnitude, the residual errors can create critical failures in electrical continuity causing the device not to yield. A simplified example is visualized in FIG. 9B where misalignment of copper interconnects between the top and bottom bonded wafer results in failure. It is expected that the residuals will be even further exacerbated by complex high order wafer deformations such as the high order wafer deformation depicted in FIG. 6B.

Figure 9A:
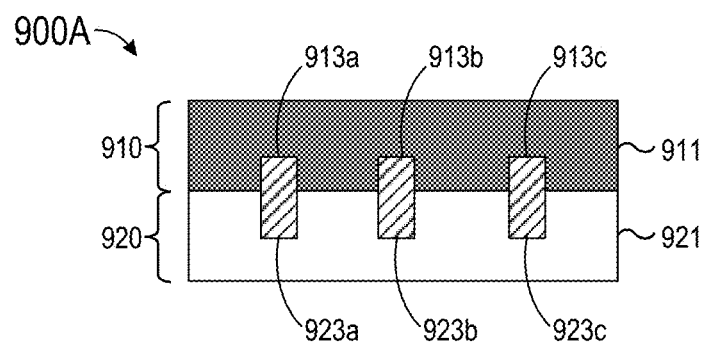
FIG. 9A shows desired bonding alignment, in accordance with one embodiment of the present disclosure.
Figure 9B:
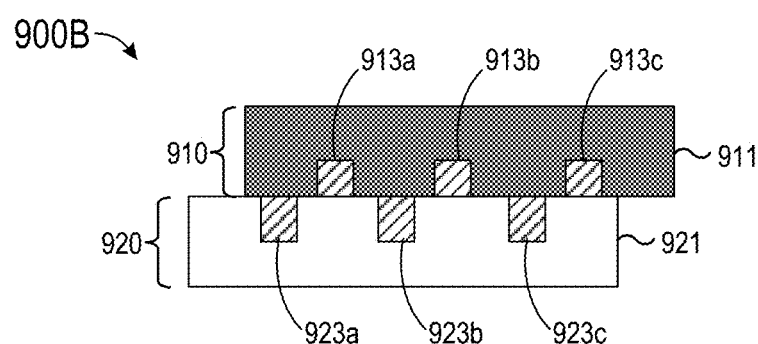
FIG. 9B shows an example of a critical bonding failure.

In FIG. 9B, a misaligned system 900B includes a first wafer 910 (or a top wafer) and a second wafer 920 (or a bottom wafer) bonded together. The first wafer 910 includes first interconnect structures 913 (for example as shown by 913a, 913b and 913c) while the second wafer 920 includes second interconnect structures 923 (for example as shown by 923a, 923b and 923c). The first interconnect structures 913 are misaligned with the second interconnect structures 923. Particularly, the first interconnect structures 913a, 913b and 913c are respectively misaligned with the second interconnect structures 923a, 923b and 923c. Therefore, the misaligned system 900B is a failure.

FIG. 9A shows an aligned system 900A. Herein, the first interconnect structures 913 are aligned with the second interconnect structures 923. Particularly, the first interconnect structures 913a, 913b and 913c are respectively aligned with the second interconnect structures 923a, 923b and 923c. While shown to be seamlessly connected, at least one interface or intermediate layer may exist between the first interconnect structures 913 and the second interconnect structures 923.

Thus, wafer distortions (or stresses) can lead to overlay errors and yield losses. These yield loses will only continue to be exacerbated as alignment tolerances shrink in the next generation chip designs of advanced node semiconductor manufacturing. It is therefore paramount that a technology exists to manipulate wafer shape favorably to enable handling of highly distorted wafers through W2W bonding tools and provide a compensation mechanism for the deficiencies present in the bonder's alignment system that are unable to address wafer grid distortion effectively, especially as the semiconductor industry enters a critical juncture with the advent of 3D packaging and shrinking alignment tolerances of next generation device designs. Such novel technology is described herein.

Figure 10:
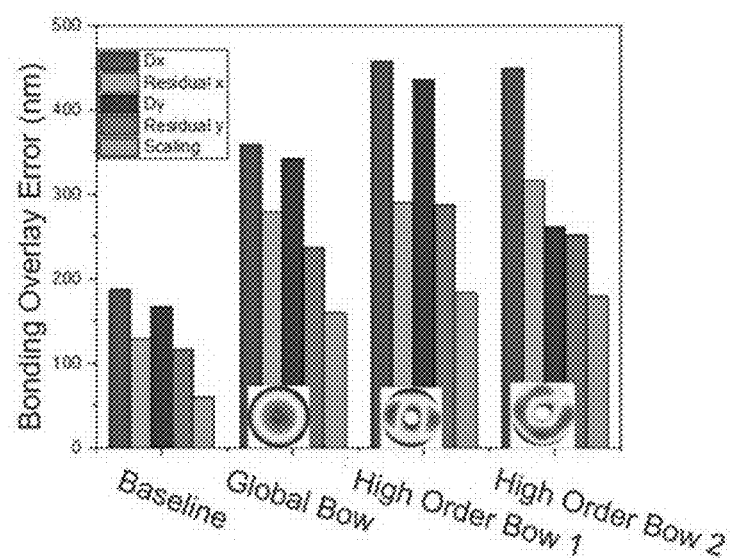
FIG. 10 shows experimental data regarding warped/bowed wafers and bonded overlay error.

FIG. 10 shows experimental data that further describes the relationship between warped/bowed wafers and bonded overlay error. At the left of FIG. 10 is "Baseline", i.e. a standard baseline process. "Global Bow", "High Order Bow 1" and "High Order Bow 2" explore the response of global bow and higher order wafer distortions. It can be seen that the uncorrectable residual component of the overlay is significantly worse than the baseline.

Techniques disclosed herein provide the industry a solution to combat process-induced wafer distortion and enable the future of packaging solutions. Techniques herein include systems and hardware to manipulate wafer shape via stress control layer(s) (also referred to as stressor film(s)). The stress control layer(s) may be locally augmented by patterning and/or activation processes to enhance the degrees of freedom. Wafer shape metrology tools and data that are conventional to the semiconductor industry can be used as an input function to engineer the correct stress of the control layer(s) and optimize augmentation locations such that W2W (wafer-to-wafer) bonding performance is enhanced. Integration of these methods can result in reduced bonding overlay residual, improved bond strength and curtailed voiding, thereby providing a commensurate yield increase. An example embodiment includes combining modules of lithography for coating, exposing, and developing as well as modules for bonding wafers. A patterning function of such tools is optimized to manipulate wafer shape via stress control layers integrated on the wafers by using heat and/or electromagnetic radiation. Accordingly, a wafer-to-wafer bonding tool is provided with shape correction functionality to increase bonding yield. Note that "wafer" and "substrate" are used interchangeably in the present disclosure.

Figure 1B:
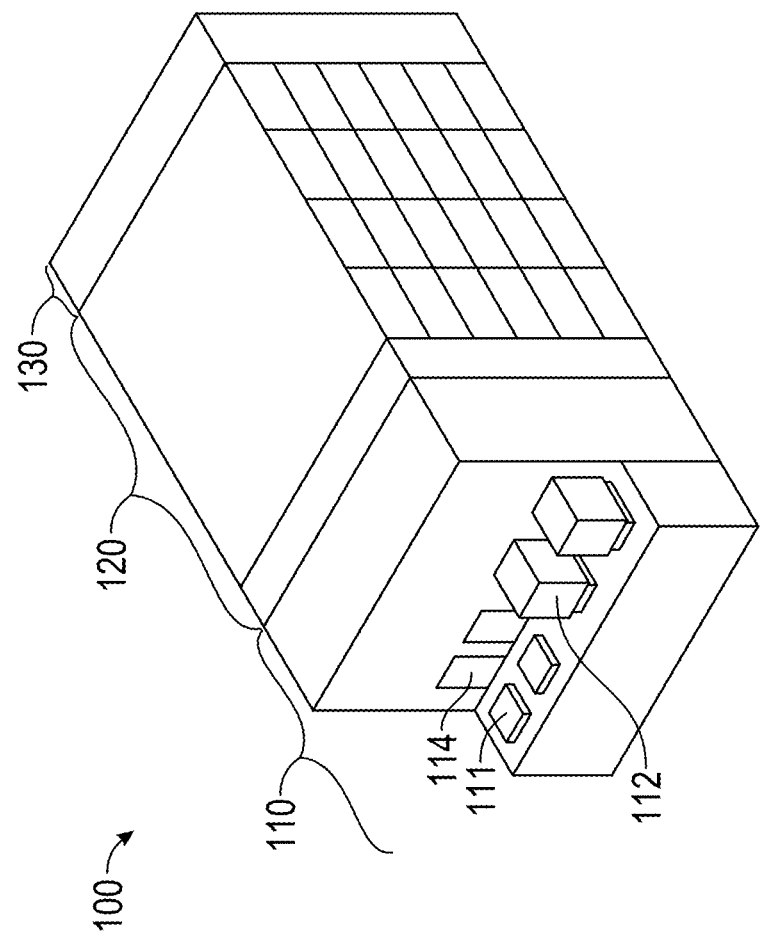
FIG. 1B is an oblique view of a hybrid system, in accordance with some embodiments of the present disclosure.

FIGS. 1A and 1B are respectively a plan view and a perspective view of a hybrid system 100, in accordance with some embodiments of the present disclosure. To begin with, the hybrid system 100 includes a first set 150 of modules configured for wafer shape correction and a second set 160 of modules configured for wafer bonding. The hybrid system 100 can also include various wafer handling components and/or carriers. A carrier block 110 includes stages 111 for receiving wafer carriers 112. The wafer carriers 112 can house several (semiconductor) wafers or substrates. A door 114 can open to access the several wafers in the wafer carriers 112. A first transfer arm 116 can transfer substrates from the wafer carriers 112 to a shelf unit 121 in a treatment block 120. A second transfer arm 123 can be positioned adjacent to the shelf unit 121 and capable of moving back and forth as well as vertically. A third transfer arm 125 can then access substrates, from the shelf unit 121 or the second transfer arm 123, to move among modules such as the first set 150 of modules and the second set 160 of modules.

In this example, the first set 150 of modules (or a wafer shape correction module) includes modules 131, 132, 133, 134, 135, 136, 137, 138 and 139. Specifically, the modules 131-139 can include a metrology module 131, a deposition module 132, a coating module 133, a bake module 134, an imaging module 135, a development module 136, an etching module 137, a cleaning module 138 and a first inspection module 139.

Briefly speaking, the metrology module 131 can be configured to measure wafer shape data such as bow of a substrate and generate a bow measurement which maps z-height deviations on the substrate relative to one or more reference z-height values. The deposition module 132 can be configured to deposit one or more films on a backside surface of the substrate (or on a front side working surface of the substrate). The coating module 133 can be configured to coat the backside surface of the substrate (or the front side working surface of the substrate) with a radiation-sensitive material, such as a photoresist. The bake module 134 can be configured to bake the radiation-sensitive material. The imaging module 135 can be configured to expose the radiation-sensitive material to a pattern of actinic radiation based on an overlay correction pattern, which will be explained later. The development module 136 can be configured to develop the radiation-sensitive material after exposure or imaging. The etching module 137 can be configured to use plasma or vapor-phase etching or wet etching. The cleaning module 138 can be configured to remove remaining (or residual) radiation-sensitive material from the substrate after an etching operation. The first inspection module 139 can be configured to inspect for defects after overlay correction processing. Note that provided herein is a brief description of the modules 131-139 for illustrative purposes. Detailed descriptions and examples of the modules 131-139 can be found in Applicant's issued U.S. Pat. No. 10,475,657, which is incorporated herein by reference in its entirety.

While shown to include all of the modules 131-139 in the example of FIG. 1A, the first set 150 of modules may only include one or more of the modules 131-139, depending on specific design needs in other examples. In one embodiment, the first set 150 of modules may include modules 131-138 without the first inspection module 139. In another embodiment, the first set 150 of modules may include modules 131-135 without modules 136-138. In yet another embodiment, the first set 150 of modules may include modules 131-132 without modules 133-138. Note that an external or outside tool may be used in lieu of at least one of the modules 131-139. In some examples, wafer metrology is performed in an outside metrology tool so that the metrology module 131 is not needed. In some embodiments, film formation is executed in an external or outside deposition tool so that the deposition 132 and/or the coating module 133 is not needed. Further, for a given module of the modules 131-139, the first set 150 of modules may include any number of the given module. For instance, the first set 150 of modules may include two metrology modules 131 so that two substrates can be characterized concurrently. The two substrates can also be characterized by one metrology module 131, sequentially or concurrently, in an alternative embodiment.

In FIG. 1A, the second set 160 of modules (or a wafer bonding module) includes modules 161, 162, 163, 164 and 165. Specifically, the modules 161-165 can include a surface preparation module 161, an alignment module 162, a (pre-)bonding module 163, a second inspection module 164 and an annealing module 165.

The surface preparation module 161 can be configured to prepare one or more substrate surfaces for subsequent bonding. For example, the surface preparation module 161 can include a plasma apparatus that is configured to generate a plasma and perform a plasma activation process on one or more substrates. The plasma activation process usually includes bombarding a substrate surface with plasma species and chemically activating the substrate surface. The surface preparation module 161 can further include a cleaning apparatus that is configured to rinse an activated substrate surface with deionized water. Note that the surface preparation module 161 may also be referred to as a cleaning module, an etching module, an activation module, a pre-treatment module and/or the like, depending on a given process performed by the surface preparation module 161.

The alignment module 162 can be configured to align two substrates, prior to bonding. For example, the two substrates may each include features such as alignment marks, and the alignment module 162 can be configured to align the alignment marks. Alignment modules are well known.

In this example, the (pre-)bonding module 163 can be configured to pre-bond or bond the two substrates together. For instance, the two substrates may be pre-bonded at a relatively low temperature, such as around room temperature or 25° C. The second inspection module 164 can optionally be configured to inspect alignment after substrate pre-bonding, for example using infrared (IR) light transmission imaging. The annealing module 165 can be configured to anneal the two substrates at a relatively high temperature, e.g. in a range of 25-400° C., in order to further bond the two substrates. In the example of FIG. 1A, the alignment module 162 and the (pre-)bonding module 163 are shown to be two separate modules. In another example (not shown), the alignment module 162 and the (pre-)bonding module 163 can be one integrated module where active alignment is executed immediately before (pre-)bonding. That is, wafer alignment and (pre-)bonding can be executed in a single module (e.g. a single tool, a single chamber, etc.) in a continuous manner, and there is no wafer transfer between alignment and (pre-)bonding.

While shown to include all of the modules 161-165 in the example of FIG. 1A, the second set 160 of modules may include one or more of the modules 161-165, depending on specific design needs in other examples. For instance, the second set 160 of modules may include modules 161-163 and 165 without the second inspection module 164. Further, for a particular module of the modules 161-165, the second set 160 of modules may include any number of the particular module. For instance, the second set 160 of modules may include two surface preparation modules 161 so that two substrates can be prepared concurrently. The two substrates can also be prepared by one surface preparation module 161, sequentially or concurrently, in an alternative embodiment.

Further, the second set 160 of modules is configured to bond two substrates via plasma activated bonding and accordingly includes the modules 161-165 in some embodiments. In other embodiments, the second set 160 of modules can be configured to bond two substrates via another wafer bonding technique, such as fusion bonding, surface activated bonding, anodic bonding, eutectic bonding, glass frit bonding, adhesive bonding, thermocompression bonding, reactive bonding, transient liquid phase diffusion bonding or the like. Accordingly, the second set 160 of modules may or may not include the modules 161-165. For instance, in the case of surface activated bonding, a surface preparation module (or a cleaning module) can be configured to clean two substrates via fast atom bombardment to atomically clean and activate surfaces of the two substrates. The two substrates can then be aligned in the alignment module 162 and bonded together in a bonding module. Thus, the second set 160 of modules can include three modules (i.e. the surface preparation module, the alignment module 162 and the bonding module) in a simple form, or may further include additional modules such as an inspection module for inspecting alignment after bonding. In the case of fusion bonding, two silicon substrates can be cleaned by a surface preparation module (or an etching module), which may be configured to perform a dry etching process or a wet etching process on the two silicon substrates, in order to achieve cleanliness required for pre-bonding. The surface preparation module may further rinse the two silicon substrates with deionized wafer to hydrophilize silicon surfaces. The two silicon substrates can then be aligned in the aligned module 162, pre-bonded in the (pre-)bonding module 163 (optionally inspected by the second inspection module 164), and annealed in the annealing module 165.

Note that the first set 150 of modules and the second set 160 of modules may have one or more modules in common. For example, the first set 150 of modules and the second set 160 of modules may include a common cleaning module which is configured to remove remaining radiation-sensitive material after an etching operation, and clean two substrates prior to pre-bonding or bonding. In other words, the common cleaning module is configured to perform functions of the cleaning module 138 and the surface preparation module 161. Further, while the modules 131-139 and the modules 161-165 are shown to be arranged consecutively in two rows in FIG. 1A, it should be understood that the modules 131-139 and 161-165 can be arranged in any arrangement, with any relative positions.

Note that the deposition module 132 and the coating module 133 may, in combination or alone, be referred to as a stressor film deposition module. The bake module 134, the imaging module 135, the development module 136, the etching module 137, the cleaning module 138 and the first inspection module 139 may, in combination or alone, be referred to as a stressor film modification module. While the modules 131-139 and 161-165 are shown to be positioned in the treatment block 120, it should be understood that one or more of the modules 131-139 and 161-165 can be positioned in another treatment block(s), such as a treatment block 130.

Still referring to FIG. 1A, a controller 140 is connected to or included by the hybrid system 100. The controller 140 can be a computer processor located within the hybrid system 100, or located remotely but in communication with components of the hybrid system 100. The controller 140 can be configured to receive wafer shape data (e.g. a bow measurement) and generate a modification map (e.g. an overlay correction pattern) based on the bow measurement. The bow measurement can be received from the metrology module 131, or from a separate system. The overlay correction pattern defines adjustments to internal stresses of the substrate (e.g. at specific locations on the substrate) based on the bow measurement. The overlay correction pattern can also be based on device parameters of the front side working surface of the substrate in addition to the bow measurement. For example, a relatively deep memory array can require more stress modification as compared to early stages of constructing a finFET device for logic. The overlay correction pattern can be generated or calculated using any of various calculation methods such as inter-plane deviation, z-height deviation from a reference plane, multi-order derivative analysis for location of interest, analysis of Zernike polynomial, pix-elated base functions optimization, or spherical Bessel functions.

In the overlay correction pattern, a first given location on the substrate may have a different internal stress adjustment defined as compared to a second given location on the substrate in the overlay correction pattern. In other words, a stress correction to be made can be specific to a location on the substrate surface. This location can be a point location, area or region of the substrate. For example, the overlay correction pattern can define internal stress adjustments to result in a flat substrate (no bowing) or some selected bowing that is advantageous to subsequent patterning processes. Such internal stress adjustments can be based on type and thickness of films deposited on the backside surface of the substrate or the front side working surface of the substrate.

In some embodiments, the controller 140 may be coupled to various components (e.g. modules) of the hybrid system 100 to receive inputs from and provide outputs to the various components. The controller 140 can be configured to control at least one module selected from the group consisting of the modules 131-139 and 161-165. For example, the controller 140 can be configured to receive wafer shape data from the metrology module 131. The controller 140 can also be configured to adjust knobs and control settings for the metrology module 131. Further, it should be understood that one or more of the functions described herein of the controller 140 can be implemented manually. For instance, knob adjustments to the metrology module 131 can be manually made.

Further, components of the hybrid system 100 can be connected to and controlled by the controller 140 that may optionally be connected to a corresponding memory storage unit and user interface (all not shown). Various module operations can be executed via the user interface, and various processing recipes and operations can be stored in a storage unit. Accordingly, a given substrate can be processed within the hybrid system 100 with various microfabrication techniques.

The controller 140 can be implemented in a wide variety of manners. In one example, the controller 140 is a computer. In another example, the controller 140 includes one or more programmable integrated circuits that are programmed to provide the functionality described herein. For example, one or more processors (e.g. microprocessor, microcontroller, central processing unit, etc.), programmable logic devices (e.g. complex programmable logic device (CPLD)), field programmable gate array (FPGA), etc.), and/or other programmable integrated circuits can be programmed with software or other programming instructions to implement the functionality of a proscribed plasma process recipe. It is further noted that the software or other programming instructions can be stored in one or more non-transitory computer-readable mediums (e.g. memory storage devices, FLASH memory, DRAM memory, reprogrammable storage devices, hard drives, floppy disks, DVDs, CD-ROMs, etc.), and the software or other programming instructions when executed by the programmable integrated circuits cause the programmable integrated circuits to perform the processes, functions, and/or capabilities described herein. Other variations could also be implemented.

Further, bow measurements herein can include measuring a degree of convexity or concavity, or map z-height deviations on the substrate relative to one or more reference z-height values. In other words, z-height deviations are spatially mapped, such as with coordinate locations, to identify z-height deviations across a surface of the substrate. Bow and z-height deviations can be mapped at various resolutions depending on types of metrology equipment used and/or a resolution desired.

The bow measurement can include raw bow data, or be represented as a bow signature with relative values. Note that in many embodiments, the reference z-height values may be all close to zero and thus representative of a wafer that is close to being flat. For example, a wafer that is close to being flat or considered flat for overlay improvement herein can be a wafer having an average deviation of less than 10 microns.

Further, the hybrid system 100 can include one or more processing modules (e.g. the first set 150 of modules) having a substrate holder and substrate treatment components configured to modify internal stresses on the substrate at specific locations on the substrate according to the overlay correction pattern, resulting in a modified bow of the substrate. The substrate with the modified bow has a modified overlay error. The modified overlay error has reduced overlay error as compared to an initial overlay error. The first set 150 of modules can be configured to differentially modify internal stresses in that the one or more processing modules are configured to independently modify different locations on the substrate such that at least a portion of the different locations are modified differently as compared to each other. Although blanket or even/symmetrical internal stress corrections can be made, the processing module herein can be configured to modify stresses by coordinate location on the substrate.

The first set 150 of modules can be configured to increase or relax internal stresses at locations on the substrate, and to modify internal stresses on either the front side working surface or the backside surface. The first set 150 of modules can be configured to hold the substrate with the front side working surface facing upwardly (away from the earth's gravitational pull) while physically modifying internal stresses on the backside surface of the substrate.

The first set 150 of modules can be configured to modify internal stresses on the substrate by location-specific addition of material on the backside surface of the substrate in that a first given location on the substrate can have more material added as compared to a second given location. For example, a backside deposition system can use chemical vapor deposition while a pattern of light or heat is projected onto the backside surface. Because chemical vapor deposition can be dependent on surface temperature, more or less material can be deposited based on a light or heat pattern projected onto the backside surface. Accordingly, differential amounts of material are deposited by coordinate location. Upon completing of such a differential deposition process, the substrate has a modified bow that corrects or reduces overlay error.

In other embodiments, the first set 150 of modules can be configured to modify internal stresses on the substrate by location-specific removal of material on the backside surface of the substrate in that a first given point location on the substrate can have more material removed as compared to a second given point location. This can include first adding one or more films to the backside surface of the substrate and then selectively removing material from the one or more films at given locations, such as by etching the backside surface using an etch mask. In other embodiments, the processing module can be configured to modify internal stresses on the substrate by location-specific implantation of particles into the backside surface of the substrate in that a first given location on the substrate can have more particles implanted as compared to a second given location. For example, an ion implantation tool can implant particles into the working surface or backside surface to either increase or reduce tensile/compressive forces thereby changing bow of the substrate. Such selective increase or reduction can depend on type of surface material being treated as well as type of particles being implanted. The processing module can be configured to modify internal stresses on the substrate by location-specific temperature modulation of a curing film. A given film being cured can develop stronger or weaker bonds based on a curing temperature. Temperature modulation can be achieved during curing by using a projection of heat or light in which individual projected pixels can be independently addressed or varied in intensity based on the overlay correction pattern.

Processing can be executed in one or more modules, depending on a type of treatment to the substrate to modify stresses. Accordingly, several modules can optionally be used. Although there are various mechanisms to modify stress (e.g. differential deposition, differential curing, ion implantation, selective etching, etc.), for convenience in describing embodiments, this disclosure will provide more example embodiments with respect to selective etching.

Figure 2A:
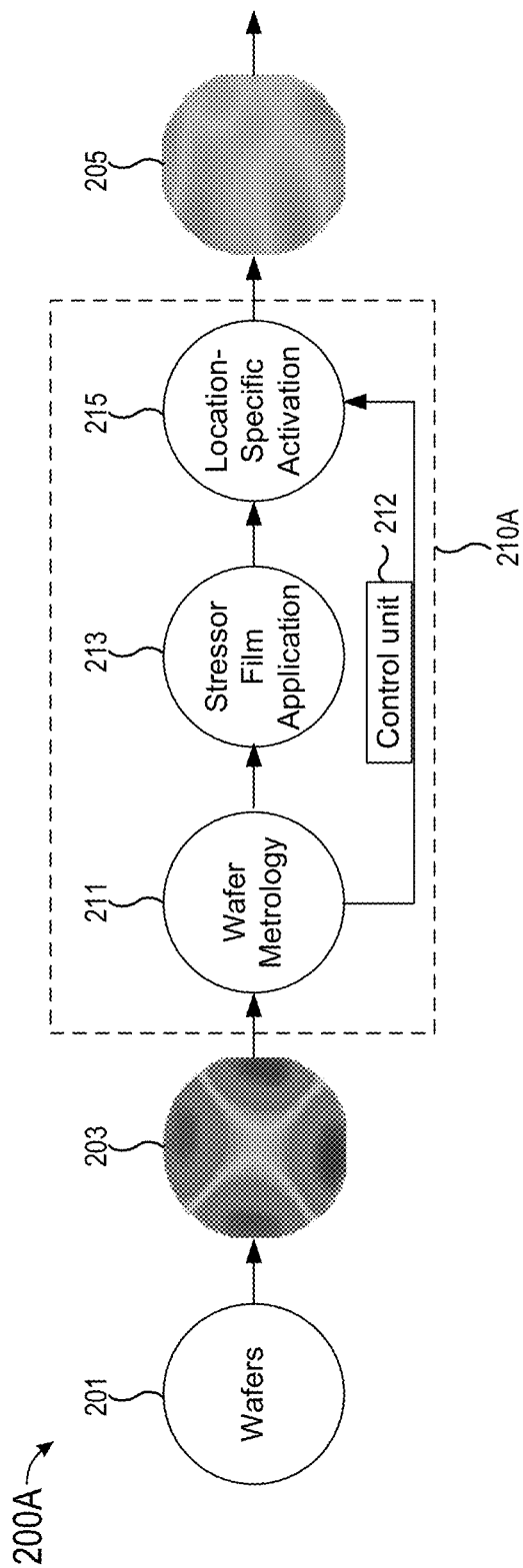
FIG. 2A shows a diagram of a process of wafer shape correction, in accordance with some embodiments of the present disclosure.

One example of a wafer shape correction flow 200A is illustrated in FIG. 2A, where top and bottom wafers intended for bonding would undergo shape metrology to record their distortion signatures. Although the depicted flow (200A) executes metrology sequentially prior to shape control layer application(s), data (e.g. bow measurements) may be collected at a previous point in the line and fed forward. Based on the integration, target shape correction can be applied to both wafers or only one. Using metrology data (e.g. bow measurements), computational methods may be employed to generate a pattern to achieve the desired shape manipulation. This pattern can be recorded in shape control layer(s) to realize the preferred shape. With optimized shape, the two wafers (i.e. the top and bottom wafers) then continue the normal integrated flow through the W2W bonding process resulting in samples that are easily handled/chucked by a bonder and result in improved bonding metrics.

Specifically, in Shape 201, wafers, such as process-distorted wafers, are provided. At least one wafer may have an initial overlay error resulting from one or more microfabrication processing steps that have been executed to create at least part of a semiconductor device on a working surface of the at least one wafer. For example, transistor gates may be completed or only partially completed.

Typically, wafers have a front side working surface and a backside surface. The front side working surface is the surface on which semiconductor devices are fabricated, such as transistors, diodes, gates, wiring, et cetera. The backside surface is typically opposite to the front side working surface and is the surface that is typically clamped or chucked to substrate holders in related examples. Techniques herein include backside surface deposition of films to modify or tune internal stresses and change a wafer bow or first order curvature.

Note that the front side working surface and the backside surface are used herein to refer to opposing sides of a wafer. In some microfabrication processes, a given wafer can have active devices or power delivery structures formed on both sides. That is, the backside surface can also be a working surface to form semiconductor devices on. The present disclosure will use the backside surface of a wafer as an example to demonstrate wafer shape control for illustrative purposes.

The wafers provided in Shape 201 can include two wafers to be bonded together, i.e. a first wafer and a second wafer. Shape 203 shows an example of the first wafer (the second wafer omitted herein for simplicity). Block 210A shows an example of a wafer shape control module (or a wafer shape correction module) which is configured to make internal stress adjustments to one or both of the two wafers. The internal stress adjustments are configured to result in a flat wafer(s) or some selected bowing that is advantageous to subsequent patterning and/or bonding processes. For example, the selected bowing can include two bowing profiles that may cancel each other out when the two wafers are bonded. The two bowing profiles can be inverse or symmetric to each other. The selected bowing can also include two bowing profiles that are similar or identical to each other so that alignment/overlay errors can be canceled out.

In Shape 211, wafer metrology is executed on the two wafers to obtain wafer shape data of the two wafers, such as bow measurements including relative z-height values. The wafer metrology can for example be implemented by the metrology module 131 or by an outside metrology tool. A control unit 212 may be configured to generate a first modification map based on the wafer shape data of the first wafer and the second wafer. The first modification map is configured to define adjustments to internal stresses of the first wafer. The control unit 212 may be implemented by the controller 140. In some embodiments, the control unit 212 may be configured to receive and/or store historic data, such as wafer shape data and/or other overlay information of historic wafers which have gone through shape correction and bonding. The historic data may be used alone, or in conjunction with the wafer shape data of the first wafer and the second wafer, to generate the first modification map.

In Shape 213, a stressor film, which can include a shape control layer, is applied to or deposited on at least one of the two wafers. The stressor film can be deposited by the stressor film deposition module (i.e. the deposition module 132 and/or the coating module 133) or by an outside film deposition tool. For example, a first stressor film can be deposited on a backside surface of the first wafer. The first stressor film can be deposited based on the first modification map. That is, the first modification map may include information regarding the first stressor film, such as type(s) of material(s), thickness(es), etc.

In Shape 215, location-specific activation is executed, for example by at least one module selected from the group consisting of the bake module 134, the imaging module 135, the development module 136 and the etching module 137. Consequently, Shape 205 shows an example of the first wafer after shape control or shape correction (the second wafer omitted herein for simplicity). Shape 205 may have a reduced bow or a reduced overlay error compared with Shape 203.

In some embodiments, the first stressor film is modified by exposing the first stressor film to a pattern of electromagnetic radiation based on the first modification map. Such exposure can be implemented by the imaging module 135. The first stressor film can undergo crosslinking/de-crosslinking to induce internal stress adjustments due to the exposure. Optionally, the first stressor film is baked, for example in the bake module 134. Such baking may further facilitate the crosslinking/de-crosslinking. Optionally, a photoresist layer of the first stressor film may be developed to form a relief pattern, for example in the development module 136. Optionally, a shape control layer of the first stressor film may be etched using the relief pattern as an etching mask, for example in the etching module 137. In some embodiments, the first stressor film is modified by heat treatment based on the first modification map. Optionally, the first stressor film may then be developed and/or etched. In some embodiments, a relatively uniform blanket film (e.g. spin-on material) can be deposited and selectively activated via UV and/or heat treatment. No film needs to be removed.

It should be noted that the first modification map is based on the wafer shape data of the two wafers so the first modification map can be specific to the two wafers. In other words, the first modification map may vary in a W2W flow. Thus, the imaging module 135 can include a direct-write exposure apparatus that is programmable. As a result, the direct-write exposure apparatus can be configured to expose the first stressor film to the pattern of electromagnetic radiation based on the (varying) first modification map. More details regarding direct-write can be found in Applicant's pending U.S. patent application Ser. No. 17/703,072 filed on Mar. 24, 2022, which is incorporated herein by reference in its entirety.

Further, the first stressor film can be any combination of films such as oxides, nitrides and/or spin-on films present on the front and/or back of the first wafer. An activation process can be the result of any combination of implant, etch, radiation and/or temperature. An example of one such embodiment is depicted in FIGS. 3A-3F. In this embodiment, a CVD (chemical vapor deposition) SiN film is used as a shape control layer of the first stressor film. The activation process includes applying a photosensitive layer, selectively exposing the resist (i.e. the photosensitive layer) with a compliant wavelength, opening the exposed areas with solvent develop and selectively removing the SiN with either a wet or RIE (reactive ion etching) process to attain the desired wafer shape. It should be noted in certain cases, activation may not be required at all and desired performance may be achieved by using a native blanket control layer(s). For example, in FIGS. 3A-3F, the flow could end after a SiN (stress control) layer is deposited. In this case, the first modification map includes no pattern so that the SiN layer is deposited and used as a blanket film.

Specifically, in FIG. 3A, a shape control layer 303 of the first stressor film is deposited on a backside of a first wafer 301. In this example, the shape control layer 303 is a SiN layer formed by CVD, for instance in the deposition module 132. In FIG. 3B, a photoresist layer 305 of the first stressor film is formed on the shape control layer 303, for instance by spin-on deposition in the coating module 133. In FIG. 3C, the photoresist layer 305 is exposed to a pattern of electromagnetic radiation based on a first modification map, for instance in the imaging module 135. In FIG. 3D, the photoresist layer 305 is developed to form a relief pattern, for instance in the development module 136. In FIG. 3E, the shape control layer 303 is etched using the relief pattern as an etching mask, for instance in the etching module 137. In FIG. 3F, the photoresist layer 305 is removed, for instance by an etching process in the etching module 137 and optionally a cleaning process in the cleaning module 138. While not shown, the photoresist layer 305 can optionally be baked between FIG. 3B and FIG. 3C, and/or baked between FIG. 3C and FIG. 3D, for instance in the bake module 134. Further, the photoresist layer 305 may be formed based on the first modification map.

Figure 4A:
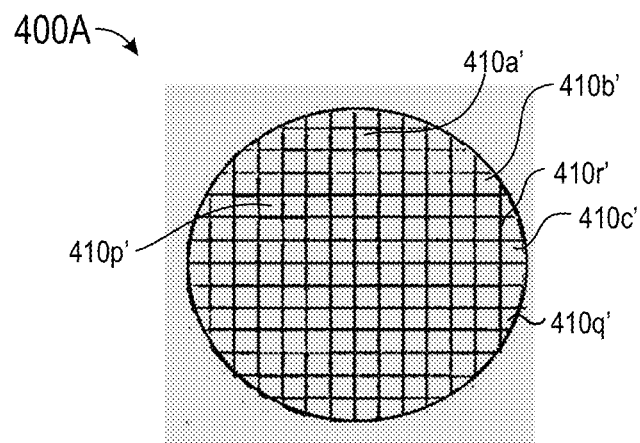
FIG. 4A shows a plan view of a heat array, in accordance with one embodiment of the present disclosure.
Figure 4B:
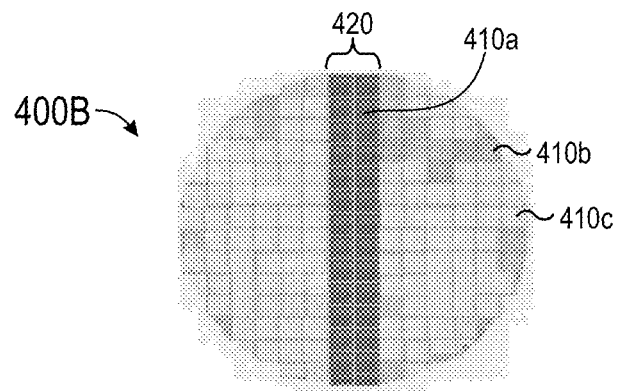
FIG. 4B shows heat zones generated by a heat array, in accordance with one embodiment of the present disclosure.
Figure 4C:
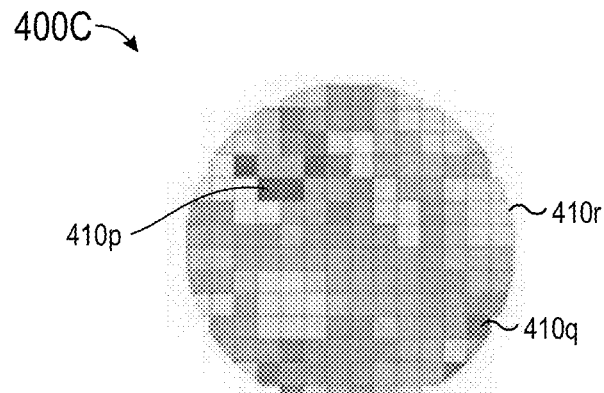
FIG. 4C shows heat zones generated by a heat array, in accordance with another embodiment of the present disclosure.

As shown in FIGS. 3A-3F, the imaging module 135 may selectively activate the first stressor film via electromagnetic radiation, similar to conventional lithography practices in the industry. Alternatively, such patterning can be executed by locally heating the wafer by a hot plate (or heat plate) with temperature control by zone or a heat array as illustrated in FIGS. 4A-4C. In some embodiments, wafer shape modification/correction can include using both electromagnetic radiation and heat as the activation vehicle.

FIG. 4A shows a plan view of a heat array 400A, in accordance with one embodiment of the present disclosure. As illustrated, the heat array 400A can include individual components, for example as shown by 410$a'$, 410$b'$, 410$c'$, 410$p'$, 410$q'$ and 410$r'$. The individual components can be configured to generate heat independent of each other, therefore enabling heat zones having independent temperature control. Size, position and temperature of each heat zone are determined by a respective individual component.

In some embodiments, the heat array 400A includes an array of resistors. Each resistor can be configured to generate a respective amount of heat based on a respective current flowing through. At least one resistor can be integrated into a wafer chuck that is configured to hold a wafer such as the first wafer. As a result, the at least one resistor may be in direct contact with the wafer. Alternatively, at least one resistor can be placed in close proximity to the wafer such that the at least one resistor can heat the wafer efficiently without touching the wafer. For instance, a distance between the at least one resistor and the wafer can be between 0 mm (in contact) and 5 mm. Of course the heat array 400A can include a combination of both types of resistors. Further, a plurality of the heat arrays 400A may be implemented. For example, a lower heat array can be implemented for a lower wafer chuck, and an upper heat array for an upper wafer chuck. The lower heat array and the upper heat array can each have configurable height positions relative to a respective wafer chuck.

FIG. 4B shows a first pattern 400B of heat zones generated by the heat array 400A, in accordance with one embodiment of the present disclosure. Herein, a darker color denotes a higher temperature while a lighter color a lower temperature. For example, Zone 410a has a higher temperature than Zone 410b which has a higher temperature than Zone 410c. The varied temperature distribution can be used to induce different degrees of internal stress adjustments to a stressor film and thus a wafer. Particularly, the first pattern 400B of heat zones includes a line pattern 420, zones of which have an identical temperature to each other. Zone 410c may represent a background temperature, e.g. no heat generated. Resistors of the heat array 400A can locally heat a wafer and thus selectively activate a stressor film in a location-specific manner.

FIG. 4C shows a second pattern 400C of heat zones generated by the heat array 400A, in accordance with another embodiment of the present disclosure. Similarly, a darker color denotes a higher temperature while a lighter color a lower temperature. For example, Zone 410p has a higher temperature than Zone 410q which has a higher temperature than Zone 410r.

Note that Zones 410a, 410b, 410c, 410p, 410q and 410r respectively correspond to individual components 410a', 410b', 410c', 410p', 410q' and 410r'. While the heat array 400A is overall shaped like a circular wafer in this example, the heat array 400A may have any other shapes. The individual components of the heat array 400A may also have any shapes. The individual components may each include a plurality of resistors. Size of the individual components thus need not be on the same order as resolution of patterning. For example, the individual component 410a' may be on the order of 33 mm×26 mm while the individual component 410a' can include smaller resistors such as micro- and/or nano-resistors.

Additionally, the heat array 400A can be included as a separate heating module (not shown) in the hybrid system 100, included by the bake module 134, or included by the deposition module 132. When the heat array 400A is included by the deposition module 132, the deposition module 132 can enable patterning during deposition to form a patterned film as deposited. Modification to such a patterned film may not be needed after film formation and before future wafer alignment. For example, CVD is temperature-dependent. Independent deposition rate control of the first stressor film can be achieved by heat zones of the heat array 400A.

While not shown, a laser system may also be used to heat a wafer chuck and/or a wafer directly. A wavelength can be selected that is absorptive at the wafer chuck and/or the wafer to cause heating.

Referring back to FIG. 2A, the first wafer is used as an example to describe the wafer shape correction flow 200A while the second wafer is omitted for simplicity purposes. In one embodiment, the second wafer is characterized by the wafer metrology in Shape 211 but does not go through processes shown in Shape 213 and Shape 215. That is, internal stress adjustments are made only to the first wafer. In another embodiment, the second wafer is characterized by the wafer metrology in Shape 211 and goes through processes shown in Shape 213 and Shape 215. Detailed descriptions have been provided above and will be omitted herein for simplicity purposes. Briefly speaking, internal stress adjustments are made to both the first wafer and the second wafer. A second stressor film can be formed on the second wafer and modified based on a second modification map that defines adjustments to internal stresses of the second wafer. The second modification map can be generated based on the wafer shape data of the first wafer and the second wafer.

Hardware to enact the processing necessary to realize wafer shape control detailed in this disclosure needs modules that are not present in any commercially available semiconductor wafer-to-wafer bonding tool. Using the wafer shape correction methods disclosed herein to optimize a wafer bonding process would require offline wafer shape correction prior to arriving at a bonder tool. This is undesirable as inserting another tool into an integrated flow would significantly impact manufacturing throughput and induce wafer handling redundancy. Embodiments disclosed herein maintain core functionality of a bonding tool (e.g. plasma activation, hydrophilization, alignment, bonding et cetera), but also includes patterning modules that enable wafer shape control such as, but not limited to, bow metrology, coating, exposure and development, or other stress activation processes. By creating a hybrid bond-patterning tool, the yield improvement attained via wafer shape control can be realized without a throughput hit induced from offline processing.

Figure 2B:
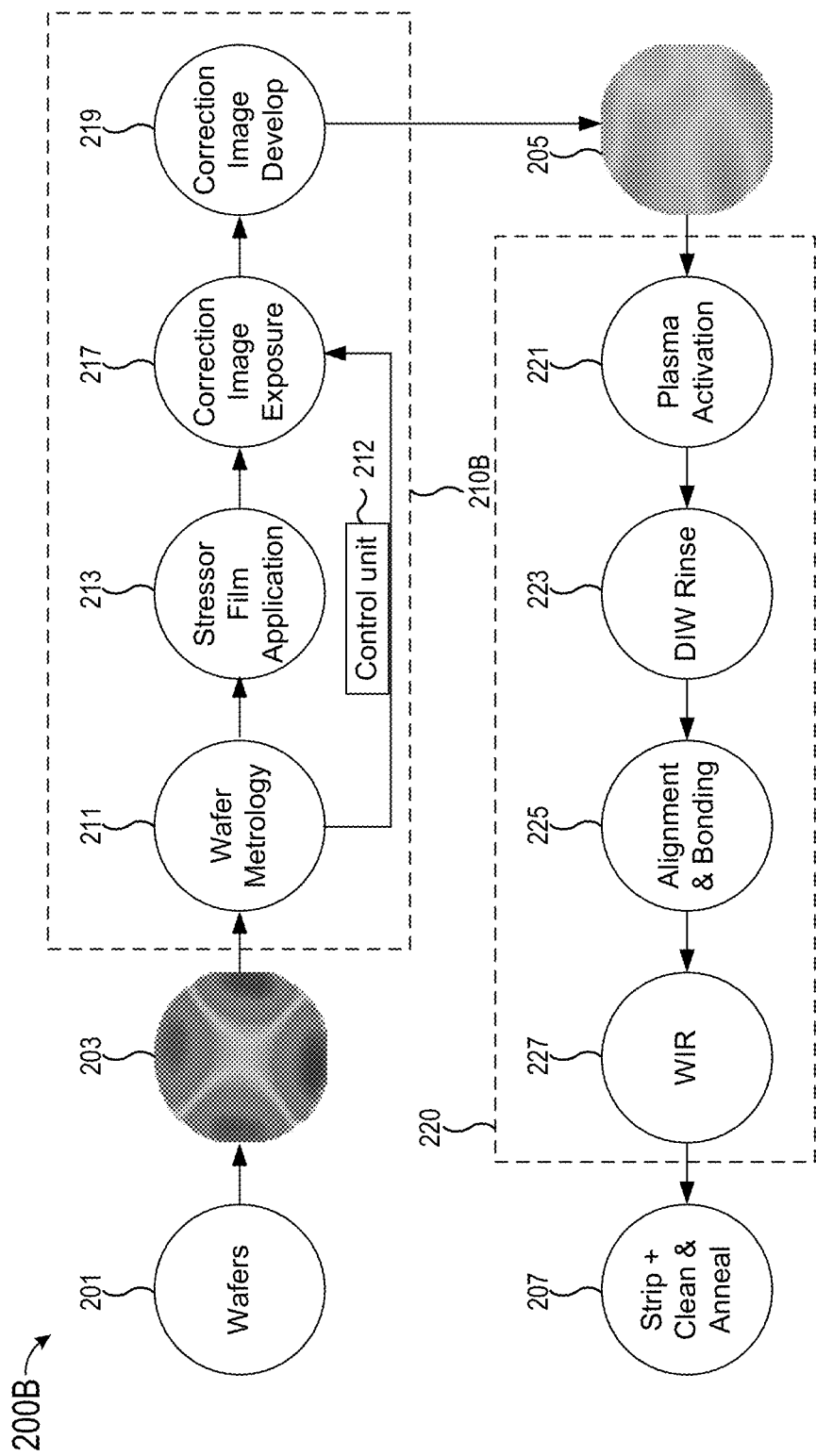
FIG. 2B shows a diagram of a process of wafer bonding, in accordance with some embodiments of the present disclosure.

An example embodiment and configuration is depicted in FIG. 2B. Embodiments include a unitary platform or stand-alone tool for wafer-to-wafer bonding that modifies wafer shape in at least one wafer of a pair of wafers to be bonded. Such a system includes a wafer shape modification module(s) (e.g. the first set 150 of modules) as well as a bonding module(s) (e.g. the second set 160 of modules). An example system (e.g. the hybrid system 100) can also include conventional wafer handling robotics to move wafers among the modules and sub-modules.

Accordingly, example embodiments include a semiconductor tool that maintains the core functionality of conventional W2W bonding platforms and also integrates patterning modules (e.g. coating, exposure, development etc.) into the bonder to facilitate wafer shape manipulation. The exposure, imaging or activation module may include electromagnetic radiation and/or location-specific heat augmentation. The semiconductor tool is capable of accessing both the front side and backside of a wafer for processing. The semiconductor tool can include integrated metrology to assess incoming wafer shape. The semiconductor tool can include integrated metrology to assess post-bond alignment metrics.

Although in a preferred embodiment, the stress control (or wafer shape control) is deposited within the tool, the semiconductor tool can accommodate a wafer with a film externally applied on a different platform. Preferably a spin-on stress control film (spin-on stressor film) is used for wafer shape modification. CVD film deposition is an alternative film deposition technique, including patterning of such a film.

As shown in FIG. 2B, a process 200B includes Block 210B configured for wafer shape control/correction and Block 220 configured for wafer alignment and bonding. Identical components in FIGS. 2A and 2B have identical numerals, e.g. 201, 203, 205, 211, 212 and 213. Block 210B can include one example of Block 210A of FIG. 2A. Specifically, the location-specific activation in Shape 215 is herein accomplished by correction image exposure in Shape 217 and correction image development in Shape 219. Such a correction image can be the first modification map for example. Likewise, internal stress adjustments can be made to a first wafer, but not to a second wafer. Alternatively, internal stress adjustments can be made to both the first wafer and the second wafer.

In Block 220, the first wafer and the second wafer can be (pre-)bonded together. In Shape 221, a plasma activation process is performed on the first wafer and the second wafer, for instance by the surface preparation module 161. In Shape 223, deionized water (DIW) is used to rinse the first wafer and the second wafer, for instance by the surface preparation module 161. In Shape 225, the first wafer and the second wafer are aligned for instance by the alignment module 162, and are (pre-)bonded for instance by the (pre-)bonding module 163. In Shape 227, (pre-)bonded wafers are inspected, for instance using IR light transmission imaging by the second inspection module 164. In Shape 207, the (pre-)bonded wafers can be stripped and cleaned for instance by the cleaning module 138 and/or the surface preparation module 161. The (pre-)bonded wafers can further be bonded, for instance by the annealing module 165. It should be understood that the first wafer and the second wafer may alternatively be bonded by other processes or techniques in the second set 160 of modules as described earlier. Block 220 may include Shape 207 in some embodiments.

Figure 5:
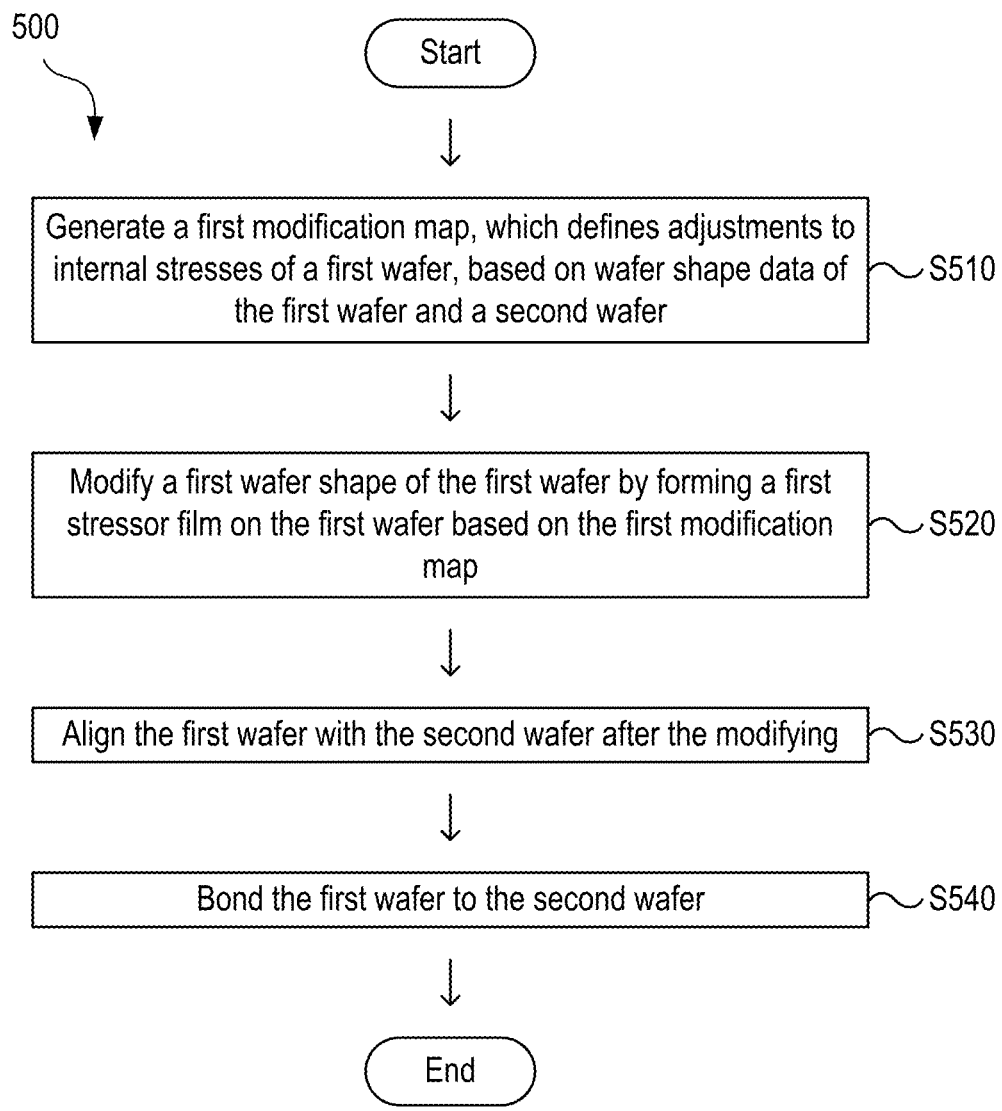
FIG. 5 shows a flow chart of a process for wafer bonding, in accordance with exemplary embodiments of the present disclosure.

FIG. 5 shows a flow chart of a process 500 for wafer bonding, in accordance with some embodiments of the present disclosure. The process 500 begins with Step S510 where a first modification map is generated based on wafer shape data of a first wafer and a second wafer. The first modification map defines adjustments to internal stresses of the first wafer. The process 500 then proceeds to Step S510 by modifying a first wafer shape of the first wafer by forming a first stressor film on the first wafer based on the first modification map. At Step S530, the first wafer is aligned with the second wafer after Step S520. At Step S540, the first wafer is bonded to the second wafer.

In the preceding description, specific details have been set forth, such as a particular geometry of a processing system and descriptions of various components and processes used therein. It should be understood, however, that techniques herein may be practiced in other embodiments that depart from these specific details, and that such details are for purposes of explanation and not limitation. Embodiments disclosed herein have been described with reference to the accompanying drawings. Similarly, for purposes of explanation, specific numbers, materials, and configurations have been set forth in order to provide a thorough understanding. Nevertheless, embodiments may be practiced without such specific details. Components having substantially the same functional constructions are denoted by like reference characters, and thus any redundant descriptions may be omitted.

Various techniques have been described as multiple discrete operations to assist in understanding the various embodiments. The order of description should not be construed as to imply that these operations are necessarily order dependent. Indeed, these operations need not be performed in the order of presentation. Operations described may be performed in a different order than the described embodiment. Various additional operations may be performed and/or described operations may be omitted in additional embodiments.

"Substrate" or "wafer" as used herein generically refers to an object being processed in accordance with the invention. The substrate may include any material portion or structure of a device, particularly a semiconductor or other electronics device, and may, for example, be a base substrate structure, such as a semiconductor wafer, reticle, or a layer on or overlying a base substrate structure such as a thin film. Thus, substrate is not limited to any particular base structure, underlying layer or overlying layer, patterned or un-patterned, but rather, is contemplated to include any such layer or base structure, and any combination of layers and/or base structures. The description may reference particular types of substrates, but this is for illustrative purposes only.

The substrate can be any suitable substrate, such as a silicon (Si) substrate, a germanium (Ge) substrate, a silicon-germanium (SiGe) substrate, and/or a silicon-on-insulator (SOI) substrate. The substrate may include a semiconductor material, for example, a Group IV semiconductor, a Group III-V compound semiconductor, or a Group II-VI oxide semiconductor. The Group IV semiconductor may include Si, Ge, or SiGe. The substrate may be a bulk wafer or an epitaxial layer.

Those skilled in the art will also understand that there can be many variations made to the operations of the techniques explained above while still achieving the same objectives of the invention. Such variations are intended to be covered by the scope of this disclosure. As such, the foregoing descriptions of embodiments of the invention are not intended to be limiting. Rather, any limitations to embodiments of the invention are presented in the following claims.

What is claimed is:

1. A method for bonding a first wafer to a second wafer, the method comprising:
generating a first modification map, which defines adjustments to internal stresses of the first wafer, based on wafer shape data of the first wafer and the second wafer;
modifying a first wafer shape of the first wafer by forming a first stressor film on the first wafer based on the first modification map;
aligning the first wafer with the second wafer after the modifying; and
bonding the first wafer to the second wafer.

2. The method of claim 1, wherein the modifying the first wafer shape of the first wafer further comprises modifying the first stressor film based on the first modification map.

3. The method of claim 2, wherein the modifying the first stressor film comprises exposing the first stressor film to a pattern of electromagnetic radiation based on the first modification map.

4. The method of claim 3, further comprising developing a photoresist layer of the first stressor film to form a relief pattern.

5. The method of claim 4, further comprising etching a shape control layer of the first stressor film using the relief pattern as an etching mask.

6. The method of claim 3, wherein the first stressor film is exposed to the pattern of electromagnetic radiation by direct-write.

7. The method of claim 2, wherein the modifying the first stressor film comprises applying heat to the first stressor film.

8. The method of claim 7, wherein the heat is applied to the first stressor film using a heat array with heat zones having independent temperature control.

9. The method of claim 8, further comprising flowing a respective current through each resistor of the heat array so that each resistor generates a respective amount of heat.

10. The method of claim 7, wherein the heat is applied to the first stressor film using a laser system that is configured to heat at least one of the first wafer or a wafer chuck that is configured to hold the first wafer.

11. The method of claim 2, wherein the modifying the first stressor film comprises implanting ions into the first stressor film.

12. The method of claim 1, further comprising keeping the first stressor film unmodified between the forming the first stressor film and the aligning the first wafer with the second wafer.

13. The method of claim 11, wherein the forming the first stressor film comprises forming the first stressor film as a blanket film.

14. The method of claim 1, wherein:
the first wafer has a front side working surface and a backside surface opposite the front side working surface, and
the first stressor film is formed on the backside of the first wafer.

15. The method of claim 1, further comprising:
generating a second modification map, which defines adjustments to internal stresses of the second wafer, based on the wafer shape data of the first wafer and the second wafer; and
modifying a second wafer shape of the second wafer by forming a second stressor film on the second wafer based on the second modification map.

16. The method of claim 15, wherein the modifying the second wafer shape of the second wafer further comprises modifying the second stressor film based on the second modification map.

17. The method of claim 1, further comprising measuring the wafer shape data of the first wafer and the second wafer using one or more metrology tools.

18. The method of claim 17, wherein the measuring the wafer shape data comprises measuring relative z-height values of the first wafer and the second wafer by bow measurement.

19. The method of claim 1, wherein the first modification map is generated based on historic data in addition to the wafer shape data of the first wafer and the second wafer, the historic data including overlay information of historic wafers.

20. A method for bonding a first wafer to a second wafer, the method comprising:
receiving wafer shape data of the first wafer and the second wafer from one or more metrology tools;
generating a first modification map and a second modification map based on the wafer shape data of the first wafer and the second wafer, wherein the first modification map defines adjustments to internal stresses of the first wafer, and the second modification map defines adjustments to internal stresses of the second wafer;
modifying a first wafer shape of the first wafer by forming a first stressor film on the first wafer based on the first modification map;
modifying a second wafer shape of the second wafer by forming a second stressor film on the second wafer based on the second modification map;
aligning the first wafer with the second wafer after the modifying the first wafer shape and after the modifying the second wafer shape; and
bonding the first wafer to the second wafer.

* * * * *